(12) United States Patent
Raghavan et al.

(10) Patent No.: US 7,510,944 B1
(45) Date of Patent: Mar. 31, 2009

(54) METHOD OF FORMING A MIM CAPACITOR

(75) Inventors: Venkat Raghavan, Union City, CA (US); Andrew Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/801,704

(22) Filed: May 10, 2007

(51) Int. Cl.
*H01L 21/20* (2006.01)

(52) U.S. Cl. ............................... 438/381; 257/E21.364

(58) Field of Classification Search .................. 438/381; 257/E21.364
See application file for complete search history.

(56) References Cited

U.S. PATENT DOCUMENTS

| | | | |
|---|---|---|---|
| 5,554,558 A | * | 9/1996 | Hsu et al. .................. 438/253 |
| 6,204,144 B1 | * | 3/2001 | Hsu ............................ 438/396 |
| 6,603,167 B2 | * | 8/2003 | Hsue et al. .................. 257/301 |
| 2005/0012223 A1 | * | 1/2005 | Koller et al. ................. 257/774 |
| 2006/0163640 A1 | * | 7/2006 | Park et al. .................... 257/306 |

* cited by examiner

*Primary Examiner*—W. David Coleman
(74) *Attorney, Agent, or Firm*—Stallman & Pollock LLP

(57) ABSTRACT

In a method of forming MIM capacitor structure, a TiW layer is formed and a capacitor mask is used to define areas of the TiW layer that will be sued in the formation of the MIM capacitor. A capacitor mask is then used to expose surface areas of the TiW layer, followed by deposition of a capacitor dielectric layer. A via mask and etch are then performed to provide a contact via to the bottom plate TiW layer. After the via etch, a Ti/TiN liner stack is deposited. The Ti/TiN multi-layer stacked film serves as the capacitor top plate as well as the via contact liner film. Next, Tungsten is deposited to fill the vias and a Tungsten planarization step is performed.

14 Claims, 3 Drawing Sheets

METHOD OF FORMING A MIM CAPACITOR

FIELD OF THE INVENTION

The present invention relates to integrated circuits and, in particular, to a method for fabricating a metal-insulator-metal (MIM) capacitor using TiW as the capacitor bottom plate and Ti/TiN as the capacitor top plate.

DISCUSSION OF THE RELATED ART

In current integrated circuit structures, capacitors are typically formed using polysilicon as the capacitor bottom electrode and Ti/TiN/AlCu as the capacitor top electrode. Contacts to the bottom electrode and to the top electrode are typically made using the first metal layer (metal1) formed in the integrated circuit structure of which the capacitor is an element.

These conventional capacitor structures are formed by etching dielectric material off of the polysilicon capacitor bottom plate. Due to variations in the post chemical mechanical polishing (CMP) thickness of this dielectric layer, the capacitor etch process is relatively difficult from a robustness standpoint. Different integrated circuit architectures will have different polysilicon pattern densities. Different polysilicon pattern densities cause the step height differences for the overlying dielectric material to be different for different circuit architectures. The CMP of the dielectric is, therefore, highly pattern density dependent.

These variations in dielectric thickness on top of the bottom plate polysilicon result in a likelihood of residual dielectric film after capacitor etch in areas where the dielectric is too thick. In areas where the dielectric is too thin, it is highly likely that the capacitor etch will cause damage to the polysilicon surface. Both of these situations lead to an undesirable lower breakdown voltage for the capacitor.

It would be desirable to have available a method of forming an integrated circuit capacitor structure that addresses the above-discussed problems

SUMMARY OF THE INVENTION

A number of integrated circuit fabrication processes are in use today that use TiW as a protection layer for precision SiCCR resistors. The present invention provides a method of integrating a MIM capacitor structure into such a process. A capacitor mask is used to define areas of TiW film that will be used in the formation of the MIM capacitor. Currently, a multilayer dielectric oxide film results on top of the TiW film due to the thin film resistor process. The capacitor mask is used to etch the dielectric film off of the TiW layer in areas where the capacitor is to be formed. Next, a dielectric film for the capacitor is deposited. A via etch mask and process etch are then used to contact the TiW bottom layer of the capacitor. After via etch, a Ti/TiN liner stack is deposited. The Ti/TiN multilayer stacked film serves as the capacitor top plate as well as the via contact liner film. Next, Tungsten is deposited to fill the vias. A planarization process for the Tungsten is then applied using either CMP or etch-back.

The features and advantages of the various aspects of the present invention will be more fully understood and appreciated upon consideration of the following detailed description of the invention and the accompanying drawings, which set forth an illustrative embodiment in which the concepts of the invention are utilized.

DETAILED DESCRIPTION OF THE INVENTION

Figure 1A:
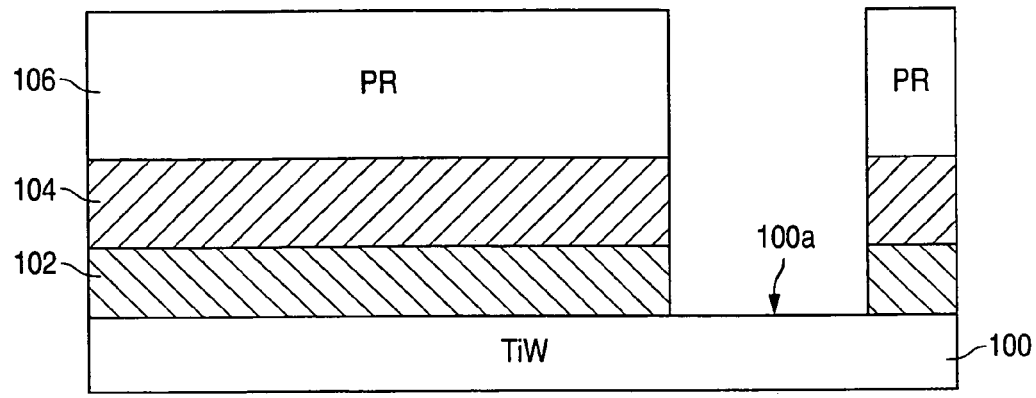
FIGS. 1A-1G are partial cross section drawings illustrating a sequence of steps for fabricating a MIM capacitor structure in accordance with the concepts of the present invention

FIGS. 1A-1G show a sequence of steps for fabricating a MIM capacitor structure in accordance with the present invention. As discussed above, these steps are preferably performed in the context of a conventional integrated circuit manufacturing process that includes a module for forming a TiW layer, such as for example, formation of TiW as a protective layer for a SiCCr resistor. However, those skilled in the art should appreciate that it is not intended that the scope of the present invention be limited to these applications. Furthermore, although the description of the embodiment of the invention provided below contains reference to specific process parameters, these specific references are intended to be illustrative and not limiting of the invention. Those skilled in the art will also appreciate that the FIGS. 1A-1G drawings are not to scale. For example, capacitors in analog applications are typically quite large, with Area 300×100 sq. µm. In the drawings, the capacitor appears to be of the same area as the via contact. Those skilled in the art will appreciate that this is not the case, since the via contact will typically have a width of about 0.7 µm.

Referring to FIG. 1A, a method of forming a MIM capacitor structure in accordance with the invention begins with the formation of a TiW layer 100, for example as a protective layer for an underlying SiCCr resistor structure (not shown). In the illustrated embodiment, the TiW layer is about 1 kA thick. FIG. 1A also shows a silicon oxide film that includes about 1.3 kA of hard mask oxide 102 and about 3 kA of interconnect oxide 104 that can be formed on the top surface of the TiW layer 100 as a result of, for example, the process steps included in the formation of a SiCCR resistor. A photoresist (PR) capacitor mask 106 is then formed and a capacitor etch is performed through the multilayer oxide 102/104 to expose a first surface area 100a of the TiW layer 100 that will be used in the formation of the MIM capacitor.

Figure 1B:
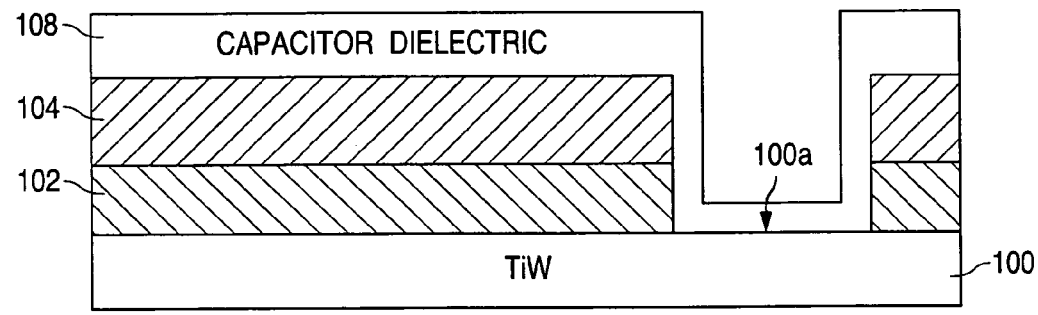

As shown in FIG. 1B, the capacitor mask 106 is then stripped and a capacitor dielectric layer 108, e.g. TEOS about 1 kA thick, is then deposited on the interconnect oxide 104, the sidewalls of the oxide trench and the exposed first surface area 100a of the TiW layer 100.

Figure 1C:
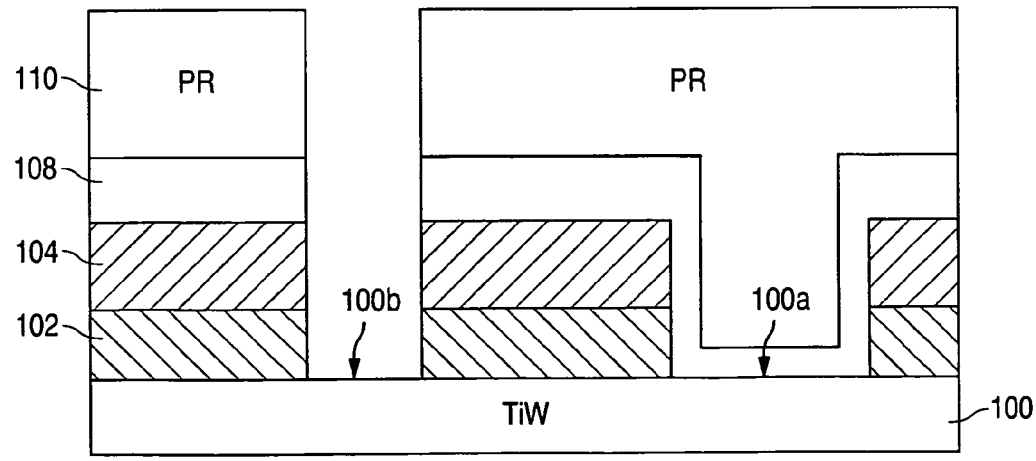
Figure 1D:
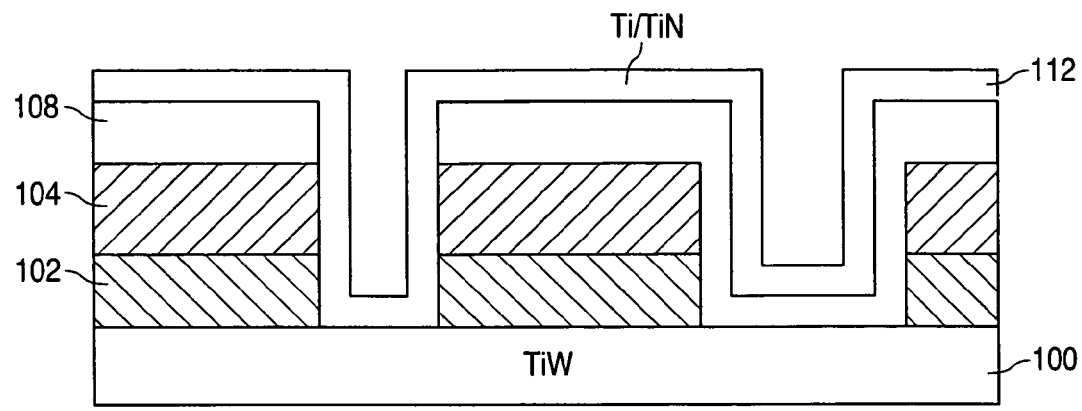

Next, as shown in FIG. 1C, a photoresist via mask 110 is formed and utilized to etch a via 112 through the capacitor dielectric and the multilayer oxide 102/104 to expose a second surface area 100b of the TiW layer 100. The via mask 110 is then stripped, followed by the formation of a Ti/TiN liner layer 112 about 1000 A thick on all exposed surfaces, including the exposed second surface area 100b of the TiW layer 100, resulting in the structure shown in FIG. 1D.

Figure 1E:
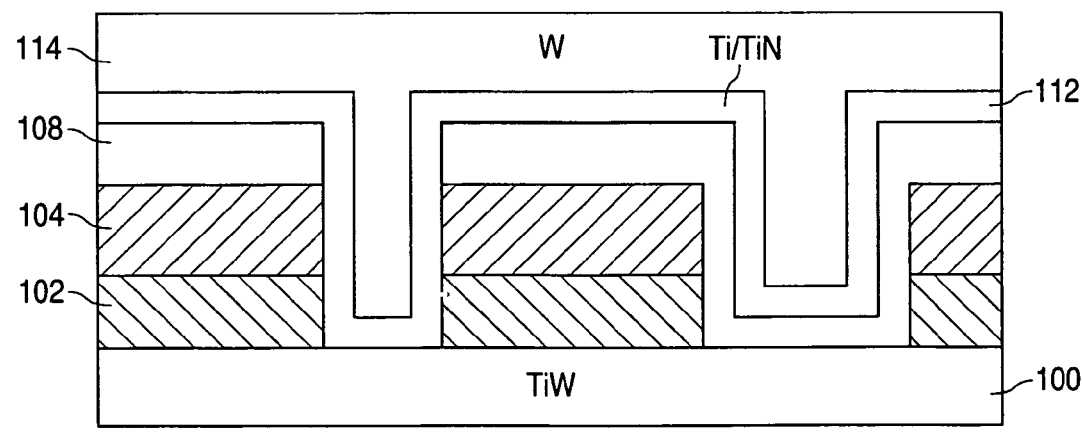
Figure 1F:
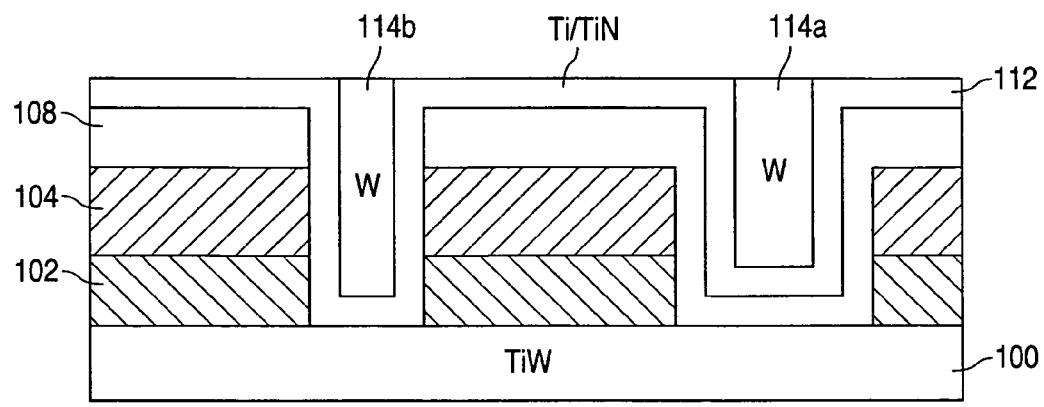

As shown in FIG. 1E, Tungsten (W) 114 is then deposited that is of sufficient thickness to fill the two trenches and leave a layer of W about 10 kA thick on the top surface. The Tungsten layer 114 is then planarized back to the Ti/TiN layer 112, using an etch back technique or CMP, to define a first Tungsten plug 114a that serves as the top plate of the MIM capacitor and a second Tungsten plug 114b that serves as the contact to the bottom plate of the MIM capacitor, i.e. the TiW layer 100, as shown in FIG. 1F.

Figure 1G:
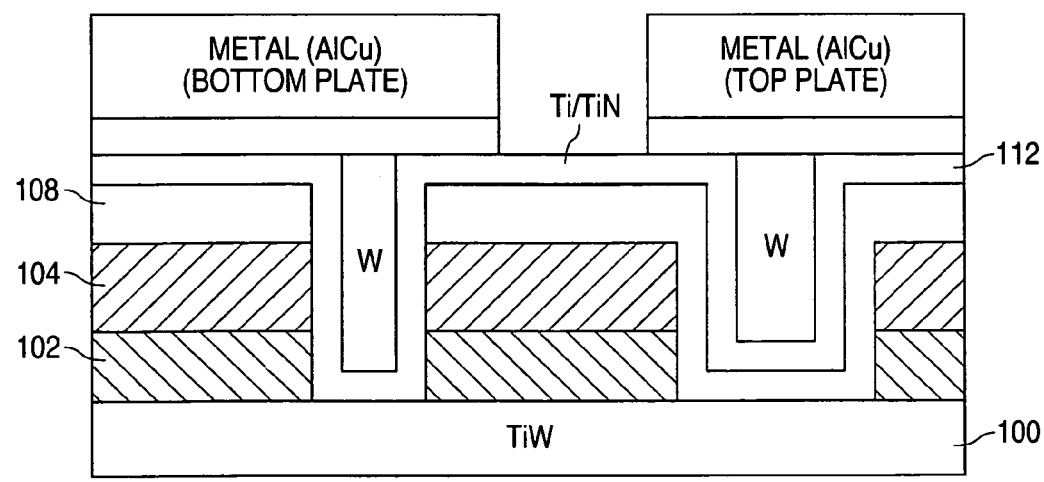

FIG. 1G shows the subsequent formation of a metal interconnects 116a and 116b, e.g. AlCu, to the first and second Tungsten plugs 114a and 114b, respectively. FIG. 1G shows the formation of additional Ti/TiN material beneath the interconnect structure.

Unlike the conventional processes, a method in accordance with the present invention is not susceptible to CMP processing of the dielectric material overlying the capacitor bottom plate, since the dielectric on top of the TiW film is deposited with little variation in thickness and there is no CMP process related variation dielectric thickness. The capacitor etch process is more robust compared to the current art, since the etch for removing deposited oxides has much more control compared to a CMP processing of a deposited dielectric. Since there is no pattern density dependent CMP variation of the dielectric to be removed by the capacitor etch, the method is robust to polysilicon pattern density changes for different circuit architectures. Capacitor reliability is much improved and the method of the present invention does not add any mask steps to the typical, existing fabrication process.

The method of the invention is also compatible with current processes that use SiCCr to form precision resistors. It is, therefore, suitable for products that require a precision SiCCr resistor and a reliable MIM capacitor.

In the method, the TiW does not get etched in HF; therefore, an option of either a wet etch or a dry etch can be used to remove the dielectric from the top surface of the TiW. Using a wet etch has two main advantages: (1) saving capacity of the usually more expensive dry etch process and (2) there is usually polymer residue from a dry etch process, making the post etch clean process more complex.

A MIM capacitor in accordance with the invention is formed at metal2. Thus, compared to the current techniques, in which the capacitor is formed at metal 1, substrate coupling is reduced, thereby improving signal to noise ratio over the current art.

It should be understood that the particular embodiments of the invention described above have been provided by way of example and that other modifications may occur to those skilled in the art without departing from the scope and spirit of the invention as express in the appended claims and their equivalents.

What is claimed is:

1. A method of forming a metal-insulator-metal (MIM) capacitor structure in conjunction with the formation of a resistor structure that includes a TiW layer and a resistor oxide layer formed on an upper surface of the TiW layer, the method comprising:
    forming a trench in the resistor oxide layer to expose a first surface area of the TiW layer;
    forming a layer of capacitor dielectric material over the resistor oxide layer, sidewalls of the trench and the exposed first surface area of the TiW layer;
    forming a via that extends through the capacitor dielectric layer and the resistor oxide layer to expose a second surface area of the TiW layer;
    forming a layer of Ti/TiN over the capacitor dielectric material, sidewalls of the via and the exposed second surface area of the TiW layer;
    forming a first W plug in the trench and a second W plug in the via; and
    forming a metal interconnect structure that includes a first metal interconnect in electrical contact with the first W plug and a second metal interconnect in electrical contact with the second W plug,
    whereby the TiW layer provides the bottom plate of the MIM capacitor structure and the Ti/TiN layer provides the top plate of the MIM capacitor structure.

2. A method as in claim 1, and wherein the TiW layer is about 1 kA thick.

3. A method as in claim 1, and wherein the resistor oxide layer is about 4.3 kA thick.

4. A method as in claim 1, and wherein capacitor dielectric material comprises silicon oxide.

5. A method as in claim 1, and wherein the Ti/TiN layer is about 1000 A thick.

6. A method as in claim 4, and wherein the silicon oxide comprises TEOS.

7. A method as in claim 6, and wherein the TEOS is about 1 kA thick.

8. A metal-insulator-metal (MIM) capacitor structure that is formed as part of integrated circuit structure having a resistor structure that includes a TiW layer and a resistor oxide layer formed on an upper surface of the TiW layer, the MIM capacitor structure comprising:
    a trench formed in the resistor oxide layer to expose a first surface area of the TiW layer, the trench having capacitor dielectric material formed on sidewalls of the trench and on the exposed first surface area of the TiW layer, Ti/TiN formed over the capacitor dielectric material to define a remaining trench portion, and a first W plug that fills the remaining trench portion;
    a via that extends through capacitor dielectric material formed on the resistor oxide layer and through the resistor oxide layer to expose a second surface area of the TiW layer, the via having Ti/TiN formed on sidewalls of the via and on the exposed second surface area of the TiW layer to define a remaining via portion, and second W plug that fills the remaining via portion;
    a first metal interconnect formed in electrical contact with the first W plug; and
    a second metal interconnect formed in electrical contact with the second W plug,
    whereby the TiW layer provides the bottom plate of the MIM capacitor structure and the Ti/TiN layer provides the top plate of the MIM capacitor structure.

9. A MIM capacitor structure as in claim 2, and wherein TiW layer is about 1 kA thick.

10. A MIM capacitor structure as in claim 2, and wherein the resistor oxide layer is about 4.3 kA thick.

11. A MIM capacitor structure as in claim 2, and wherein the capacitor dielectric material comprises silicon oxide.

12. A MIM capacitor structure as in claim 2, and wherein the Ti/TiN layer is about 1000 A thick.

13. A MIM capacitor structure as in claim 11, and wherein the silicon oxide comprises TEOS.

14. A MIM capacitor structure as in claim 13, and wherein the TEOS is about 1 kA thick.

* * * * *